(12) United States Patent
Dong et al.

(10) Patent No.: US 9,411,727 B2
(45) Date of Patent: *Aug. 9, 2016

(54) SPLIT WRITE OPERATION FOR RESISTIVE MEMORY CACHE

(71) Applicant: QUALCOMM INCORPORATED, San Diego, CA (US)

(72) Inventors: Xiangyu Dong, San Diego, CA (US); Xiaochun Zhu, San Diego, CA (US); Jungwon Suh, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/963,201

(22) Filed: Dec. 8, 2015

(65) Prior Publication Data

US 2016/0092355 A1    Mar. 31, 2016

Related U.S. Application Data

(62) Division of application No. 14/062,558, filed on Oct. 24, 2013, now Pat. No. 9,239,788.

(51) Int. Cl.
| | |
|---|---|
| *G06F 12/08* | (2016.01) |
| *G11C 7/10* | (2006.01) |
| *G11C 11/16* | (2006.01) |
| *G06F 13/00* | (2006.01) |

(52) U.S. Cl.
CPC ............ *G06F 12/0802* (2013.01); *G06F 12/08* (2013.01); *G06F 12/0855* (2013.01); *G11C 7/1015* (2013.01); *G11C 7/1039* (2013.01); *G11C 11/1673* (2013.01); *G11C 11/1675* (2013.01); *G06F 12/0864* (2013.01); *G06F 2212/1016* (2013.01); *G06F 2212/22* (2013.01); *G06F 2212/222* (2013.01); *G06F 2212/60* (2013.01); *G11C 2207/229* (2013.01); *G11C 2207/2245* (2013.01); *G11C 2207/2272* (2013.01); *G11C 2207/2281* (2013.01)

(58) Field of Classification Search
CPC .......... G06F 12/08; G06F 12/00; G06F 13/00
USPC .............................. 710/51, 36, 5, 33; 711/117
See application file for complete search history.

(56) References Cited

U.S. PATENT DOCUMENTS

| | | |
|---|---|---|
| 8,004,884 B2 | 8/2011 | Franceschini et al. |
| 8,120,948 B2 | 2/2012 | Nakayama et al. |
| 8,169,818 B2 | 5/2012 | Ohmori et al. |
| 8,452,912 B2 | 5/2013 | Lee et al. |
| 8,458,363 B2 | 6/2013 | Rosenblatt et al. |
| 8,463,979 B2 | 6/2013 | Schuette |
| 9,239,788 B2 * | 1/2016 | Dong ..................... G06F 12/08 |
| 2005/0273564 A1 | 12/2005 | Lakshmanamurthy et al. |
| 2008/0266991 A1 | 10/2008 | Lee et al. |

(Continued)

OTHER PUBLICATIONS

International Search Report and Written Opinion—PCT/US2014/058668—ISA/EPO—Dec. 12, 2014.

*Primary Examiner* — Christopher Shin
(74) *Attorney, Agent, or Firm* — Seyfarth Shaw LLP

(57) ABSTRACT

A method of reading from and writing to a resistive memory cache includes receiving a write command and dividing the write command into multiple write sub-commands. The method also includes receiving a read command and executing the read command before executing a next write sub-command.

18 Claims, 7 Drawing Sheets

(56) References Cited

U.S. PATENT DOCUMENTS

| | | |
|---|---|---|
| 2010/0042954 A1 | 2/2010 | Rosenblatt et al. |
| 2010/0082784 A1 | 4/2010 | Rosenblatt et al. |
| 2011/0162048 A1 | 6/2011 | Bilbrey et al. |
| 2011/0286280 A1 | 11/2011 | Kellam et al. |
| 2015/0121006 A1 | 4/2015 | Dong et al. |

* cited by examiner

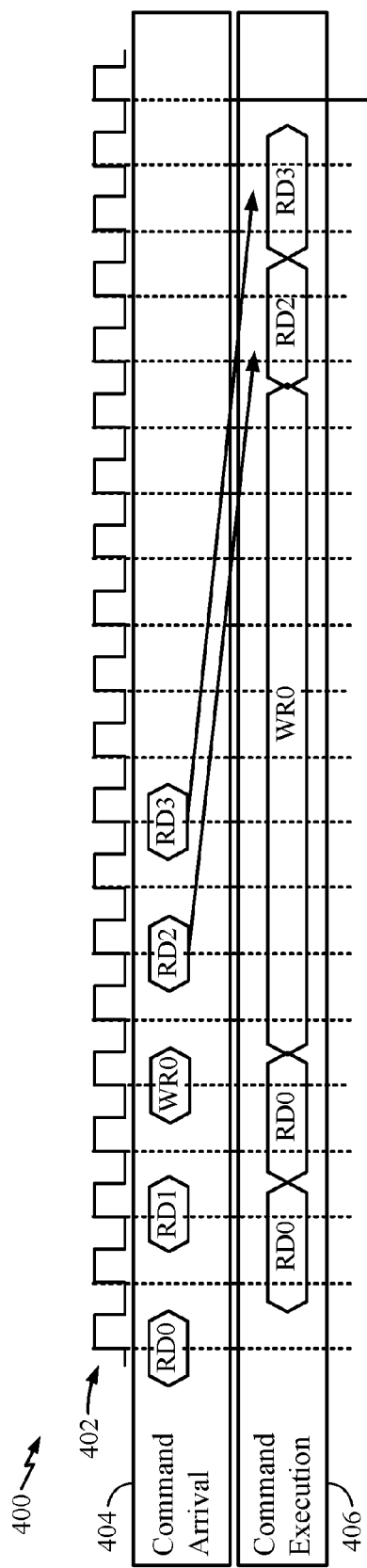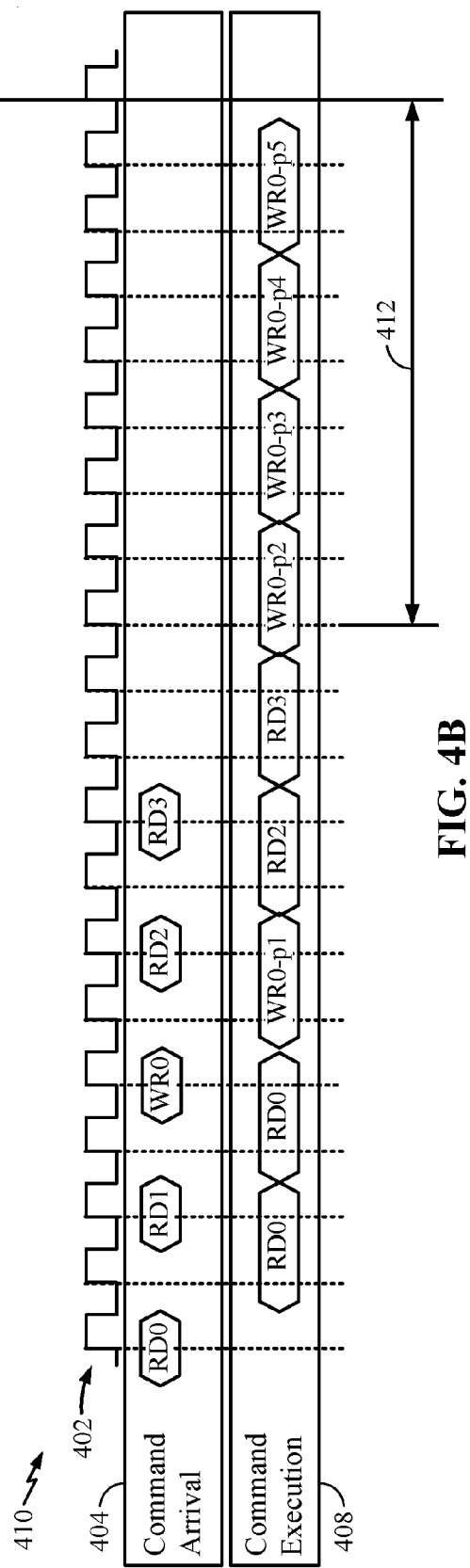
FIG. 4A
FIG. 4B

SPLIT WRITE OPERATION FOR RESISTIVE MEMORY CACHE

CROSS-REFERENCE TO RELATED APPLICATION

This application is a divisional of U.S. patent application Ser. No. 14/062,558, entitled "SPLIT WRITE OPERATION FOR RESISTIVE MEMORY CACHE," filed on Oct. 24, 2013, the disclosure of which is expressly incorporated by reference herein in its entirety.

TECHNICAL FIELD

The present disclosure generally relates to resistive memories such as magnetic random access memory (MRAM) devices or resistive random access memory (RRAM) devices. More specifically, the present disclosure relates to improving resistive memory cache performance by splitting write operations.

BACKGROUND

Unlike conventional random access memory (RAM) chip technologies, in magnetic RAM (MRAM) data is not stored as electric charge, but is instead stored by magnetic polarization of storage elements. The storage elements are formed from two ferromagnetic layers separated by a tunneling layer. One of the two ferromagnetic layers, which is referred to as the fixed layer or pinned layer, has a magnetization that is fixed in a particular direction. The other ferromagnetic magnetic layer, which is referred to as the free layer, has a magnetization direction that can be altered to two different states. These different states of the free layer are used to represent either a logic "1" when the free layer magnetization is anti-parallel to the fixed layer magnetization or a logic "0" when the free layer magnetization is parallel to the fixed layer magnetization, or vice versa. One such device having a fixed layer, a tunneling layer, and a free layer is a magnetic tunnel junction (MTJ). The electrical resistance of an MTJ depends on whether the free layer magnetization and fixed layer magnetization are parallel or anti-parallel with each other. A memory device such as MRAM is built from an array of individually addressable MTJs.

To write data in a conventional MRAM, a write current, which exceeds a critical switching current, is applied through an MTJ. The write current exceeding the critical switching current is sufficient to change the magnetization direction of the free layer. When the write current flows in a first direction, the MTJ can be placed into or remain in a first state, in which its free layer magnetization direction and fixed layer magnetization direction are aligned in a parallel orientation. When the write current flows in a second direction, opposite to the first direction, the MTJ can be placed into or remain in a second state, in which its free layer magnetization and fixed layer magnetization are in an anti-parallel orientation.

To read data in a conventional MRAM, a read current may flow through the MTJ via the same current path used to write data in the MTJ. If the magnetizations of the MTJ's free layer and fixed layer are oriented parallel to each other, the MTJ presents a resistance that is different than the resistance the MTJ would present if the magnetizations of the free layer and the fixed layer were in an anti-parallel orientation. In a conventional MRAM, two distinct states are defined by two different resistances of an MTJ in a bitcell of the MRAM. The two different resistances represent a logic 0 and a logic 1 value stored by the MTJ.

To determine whether data in a conventional MRAM represents a logic 1 or a logic 0, the resistance of the MTJ in the bitcell is compared with a reference resistance. The reference resistance in conventional MRAM circuitry is a midpoint resistance between the resistance of an MTJ having a parallel magnetic orientation and an MTJ having an anti-parallel magnetic orientation. One way of generating a midpoint reference resistance is coupling in parallel an MTJ known to have a parallel magnetic orientation and an MTJ known to have an anti-parallel magnetic orientation in parallel with each other.

SUMMARY

In one aspect of the present disclosure, a method of reading from and writing to a resistive memory cache is disclosed. The method includes receiving a write command. The method also includes dividing the write command into a set of write sub-commands. The method further includes receiving a read command. The method also includes executing the read command before executing a next write sub-command.

In another aspect, a resistive memory cache is disclosed. The resistive memory cache includes a multiplexer including at least one input port and at least one output port. The resistive memory cache also includes a memory coupled to the output port(s) of the multiplexer. The resistive memory cache further includes a write buffer coupled to the input port(s) of the multiplexer. The write buffer also has at least one write buffer entry including data, an address and a write command pulse counter.

Another aspect discloses a resistive memory cache. The resistive memory cache includes a multiplexer having at least one input port and at least one output port. The resistive memory cache also includes means for storing data coupled to the output port(s) of the multiplexer. The resistive memory cache further includes means for buffering write commands coupled to the input port(s) of the multiplexer. The means for buffering write commands also has at least one write buffer entry including a data, an address and a write command pulse counter.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

FIGS. 4A-4B are timing diagrams illustrating different write pulse configurations according to aspects of the present disclosure.

DETAILED DESCRIPTION

Figure 1:
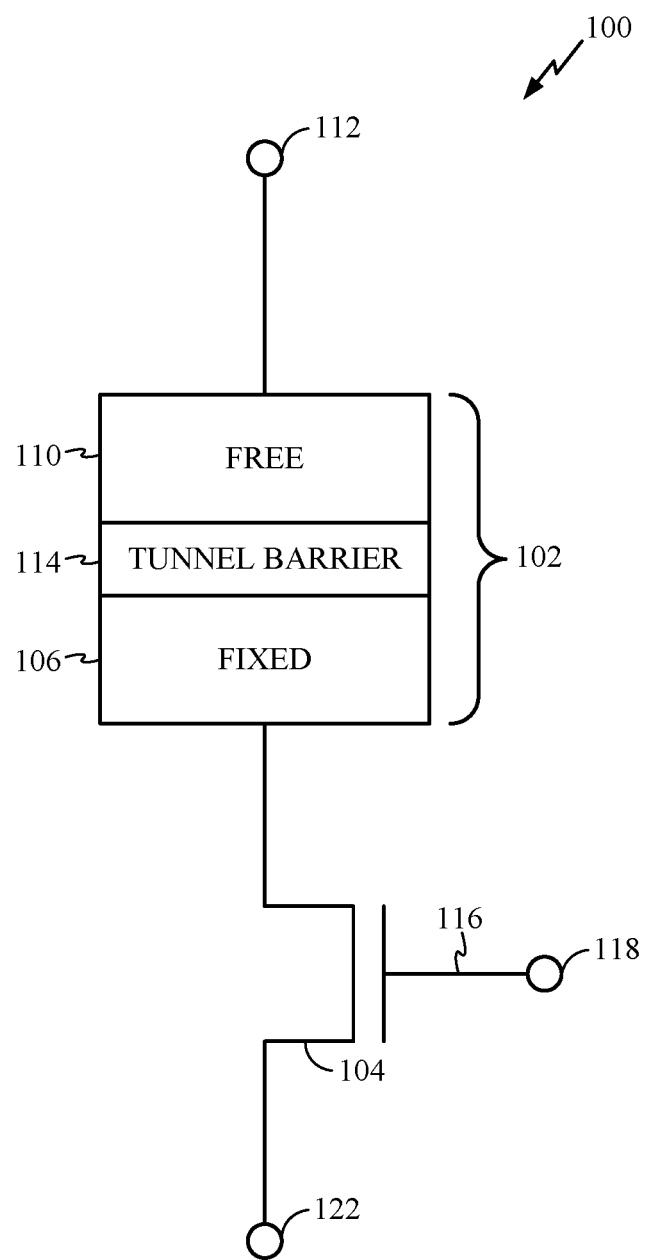
FIG. 1 is a diagram of a magnetic tunnel junction (MTJ) device connected to an access transistor.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

For an accurate resistive memory device, the probability of successfully switching a resistive memory bit cell from "0" to "1" or from "1" to "0" should be close to 100%. The switching probability can be calculated from the below equation (1):

$$P_{sw} = 1 - \exp\left\{-\frac{t_{sw}}{\tau_0}\exp\left[-\Delta\left(1 - \frac{J}{J_C}\right)\right]\right\} \quad (1)$$

Where Psw is the switching probability, exp(x) is the exponential function, $t_{sw}$ is the switching pulse, $\tau_0$ is the normalized delay, $\Delta$ is the thermal stability, J is the switching current and $J_C$ is the critical current. The normalized delay ($\tau_0$), thermal stability ($\Delta$) and critical current ($J_C$) are all parameters related to the materials of magnetic random access memories (MRAM) or other similar resistive memories.

Generally, to reach a high switching probability (Psw) close to 100%, a large switching current (J) and a long switching pulse ($t_{sw}$) are used. Because a resistive memory device cannot be read during a write pulse, long write pulses create longer write latency. This leads to slower memory and system performance.

In one aspect of the disclosure, multiple short write pulses are applied to the resistive memory device instead of one long write pulse. Applying multiple short write pulses to the resistive memory device allows for read operations to be performed within the same time period as one long write pulse. For example, one long write pulse can be expressed in the below equation (2) with the switching pulse of $t_{sw}$:

$$P_{sw,1,long} = 1 - \exp\left(-\frac{t_{sw}}{\tau_0}B\right) \quad (2)$$

where B represents the below quantity assuming a fixed switching current (J) and critical current ($J_C$) value, as shown in equation (3):

$$B = -\Delta\left(1 - \frac{J}{J_C}\right) \quad (3)$$

If one long pulse is expressed by the above equation (2), then one short write pulse can be expressed by equation (4). The same overall switching pulse value $t_{sw}$ is applied, but each write pulse is a short 1/n fraction of a single switching pulse ($t_{sw}/n$) as seen below.

$$P_{sw,1,short} = 1 - \exp\left(-\frac{t_{sw}}{n\tau_0}B\right) \quad (4)$$

Therefore, applying n short write pulses can be expressed by the below equation (5), and ends up being equal to one long write pulse.

$$\begin{aligned}
P_{sw,n,short} &= 1 - (1 - P_{sw,1,short})^n \quad (5) \\
&= 1 - \left[\exp\left(-\frac{t_{sw}}{n\tau_0}B\right)\right]^n \\
&= 1 - \exp\left(\frac{t_{sw}}{\tau_0}B\right) \\
&= P_{sw,1,long}
\end{aligned}$$

In one aspect of the disclosure, a method of reading from and writing to a resistive memory cache includes receiving a write command and converting that write command into a number of smaller write command pulses instead of processing it as one large write command pulse. The method may also include receiving a read command and executing that read command before executing a next write command pulse.

A write buffer entry may also be created in response to receiving the write command. The entry includes data, an address, and a number of write command pulses remaining. The number of write command pulses remaining may be implemented as a counter and may start from zero and count up, or start from n and count down. Every time a write command is executed, the number of write command pulses is modified (either incremented or decremented) to represent that n write command pulses have been executed.

FIG. 1 illustrates a memory cell 100 including a magnetic tunnel junction (MTJ) 102 coupled to an access transistor 104. A free layer 110 of the MTJ 102 is coupled to a bit line 112. The access transistor 104 is coupled between a fixed layer 106 of the MTJ 102 and a fixed potential node 122. A tunnel barrier layer 114 is coupled between the fixed layer 106 and the free layer 110. The access transistor 104 includes a gate 116 coupled to a word line 118.

Synthetic anti-ferromagnetic materials may be used to form the fixed layer 106 and the free layer 110. For example, the fixed layer 106 may comprise multiple material layers including a Cobalt Iron Boron (CoFeB) layer, a Ruthenium (Ru) layer and a Cobalt Iron (CoFe) layer. The free layer 110 may be an anti-ferromagnetic material, such as CoFeB, and the tunnel barrier layer 114 may be Magnesium Oxide (MgO), for example. The memory cell 100 is an example of a resistive memory element making up a cache memory or other resistive memory device.

Figure 2:
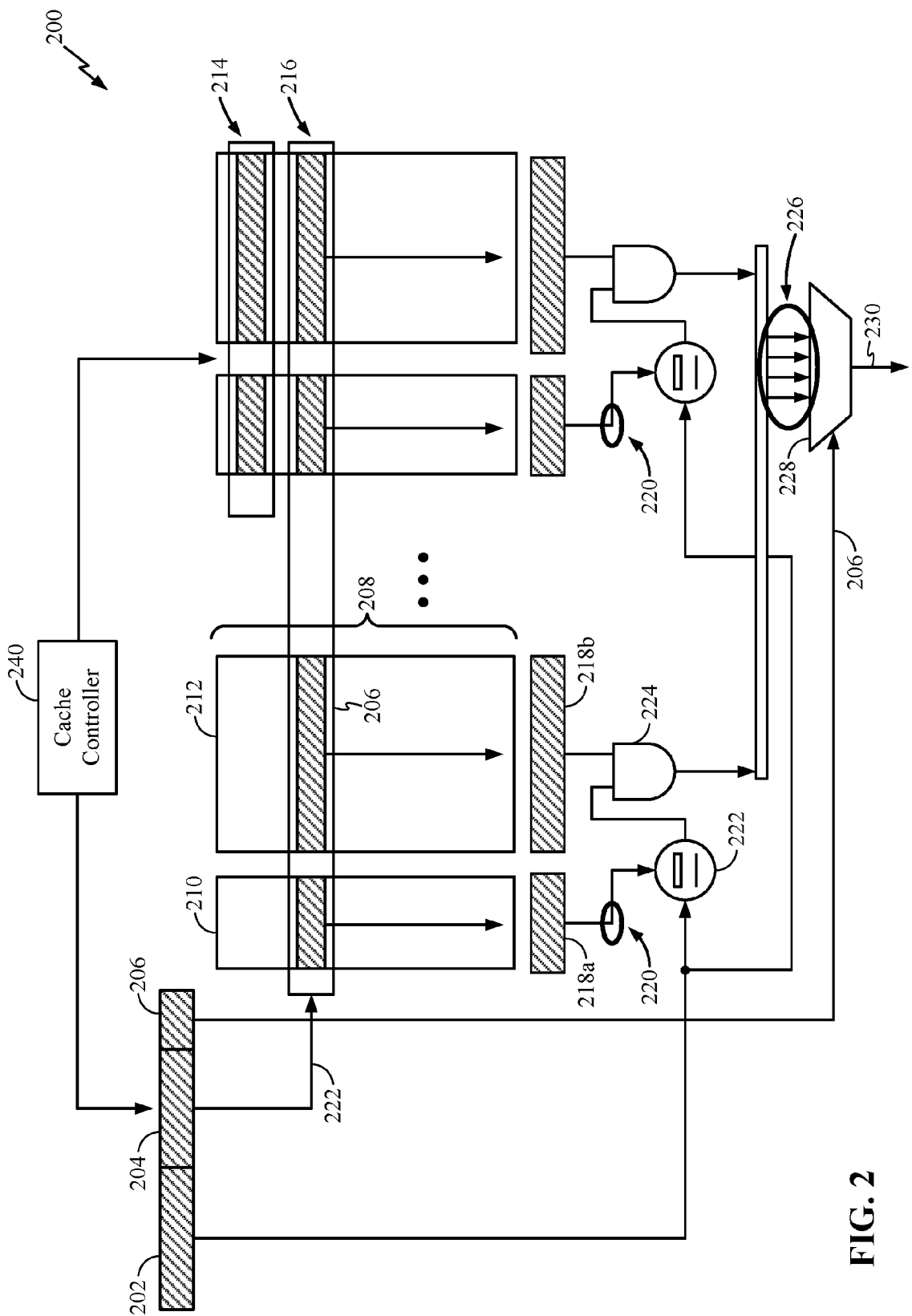
FIG. 2 is a diagram of an example cache memory including a cache controller according to an aspect of the present disclosure.

FIG. 2 is a diagram of an example cache memory 200 including a cache controller 240 according to an aspect of the present disclosure. A cache memory 200 includes a page number 202, a set number 204, a byte number 206, a cache way 208, a tag portion 210, a data portion 212, a cache block 214, one or more cache sets 216, a tag sense amplifier 218a, a data sense amplifier 218b, a tag output 220, a comparator 222, a logic gate 224, a cache group 226, select circuitry 228, and a word output 230.

An address in the cache memory 200 may include the page number 202, the set number 204 and the byte number 206. In one implementation, the page number 202 may be a virtual page number. The set number 204 corresponds to one of the cache sets 216. The cache block 214 includes the tag portion 210 and the data portion 212. The tag portion 210 may contain part of the address of the actual data in the data portion 212, or other identifying information to locate the data in the data portion 212. The data portion 212 contains the actual data. One of the cache sets 216 is one set of cache blocks 214, as can be seen by the horizontal grouping in FIG. 2. The cache way 208 is another group of cache blocks 214, but in a vertical grouping, as can be seen in FIG. 2. The tag sense amplifier 218a and data sense amplifier 218b sense logic levels from the cache entries so the data is properly interpreted (as a logic 1 or 0) when output.

The data at the tag output 220, which is the output of the tag sense amplifier 218a, may contain a page frame number, a valid bit and coherence bits. The data from the tag output 220 is then compared to the page number 202 by the comparator 222, which determines if the two values are equal. If the values are equal, then the output of the comparator 222 is input, along with the output of the data sense amplifier 218b, into the logic gate 224. The output of the logic gate 224 appears in the cache group 226. In one implementation, one of the cache groups 226 contains multiple words. The cache group 226 is input into select circuitry 228, which uses the byte number 206 as a select input. The output of the select circuitry 228 using the byte number 206 as the select input is the word output 230.

FIG. 2 is an example block diagram for an n-way set-associative cache, however, there may be other types of caches used in accordance with the present disclosure. A set-associative cache can be made of several direct-mapped caches operating in parallel (for example, one direct-mapped cache could be a cache entry including the tag portion 210 and the data portion 212). The data readout may be controlled by a tag comparison with the page number 202 as well as the block-valid bit (which can be part of the tag or metadata entry) and the page permissions (part of the page number 202). The cache column size may also equal the virtual memory page size, and the cache index may not use bits from the page number 202 or virtual page number.

Figure 3:
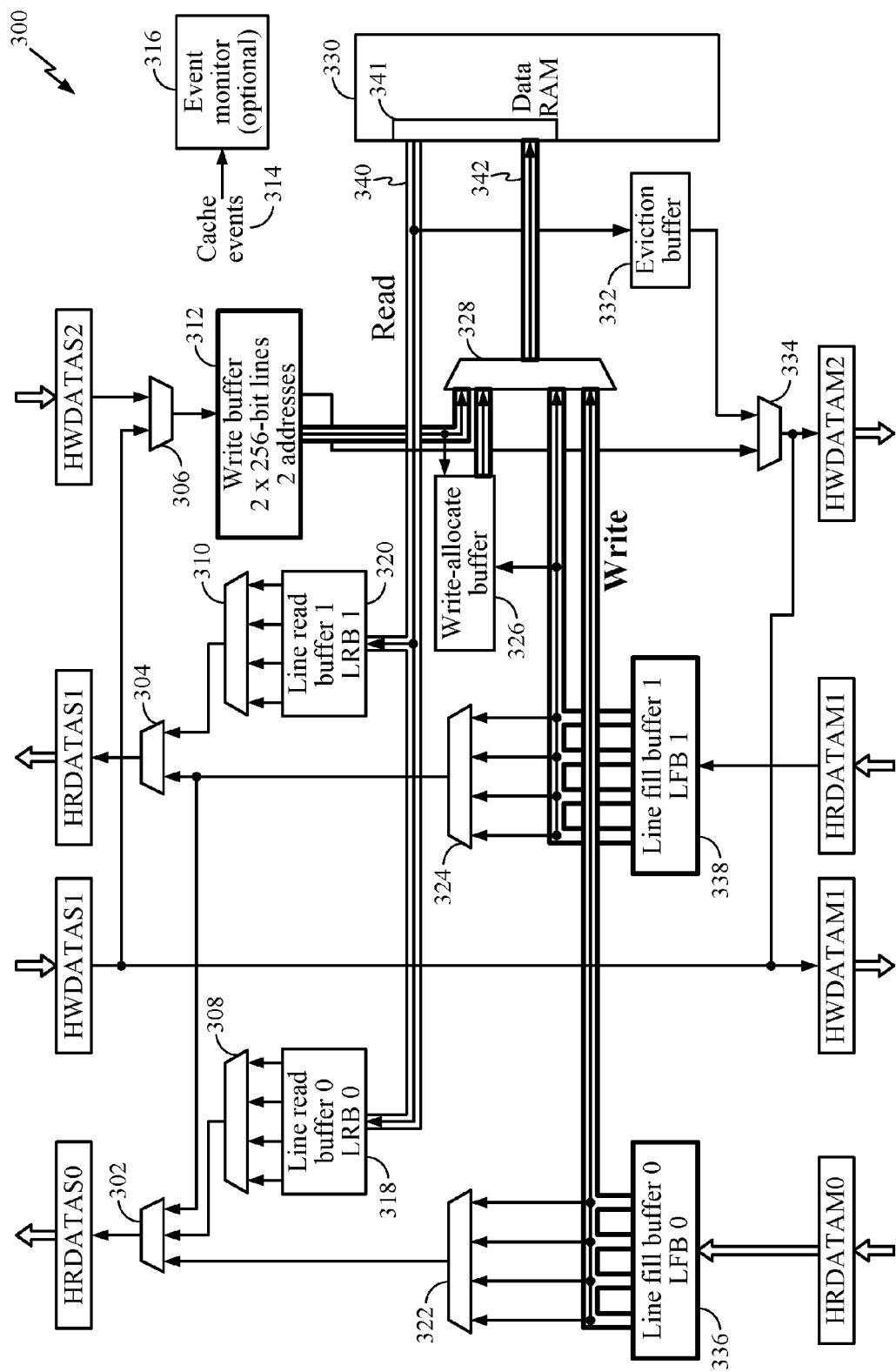
FIG. 3 is a schematic of a resistive memory cache illustrating a read path and a write path according to an aspect of the present disclosure.

FIG. 3 is a schematic of a resistive memory cache 300 illustrating a read path and a write path according to an aspect of the present disclosure. The signals input to the resistive memory cache 300 include a first input data write signal HWDATAS1, a second input data write signal HWDATAS2, a first input data read signal HRDATAM0, and a second input data read signal HRDATAM1. The signals output from the resistive memory cache 300 includes first output data read signal HRDATAS0, a second output data read signal HRDATAS1, a first output data write signal HWDATAM1 and a second output data write signal HWDATAM2. The resistive memory cache 300 includes a first multiplexer 302 that outputs the HRDATAS0 signal, a second multiplexer 304 that outputs the HRDATAS1 signal, a third multiplexer 306 that receives the HWDATAS1 signal and the HWDATAS2 signal, a fourth multiplexer 308 that receives input from a first line read buffer 318, a fifth multiplexer 310 that receives input from a second line read buffer 320, a sixth multiplexer 322 that receives input from a first line fill buffer 336, a seventh multiplexer 324 that receives input from a second line fill buffer 338, a main multiplexer 328, and an eighth multiplexer 334 that outputs the HWDATAM2 signal.

The resistive memory cache 300 also includes a write buffer 312 that receives input from the third multiplexer 306 and outputs data to the main multiplexer 328, to a write allocate buffer 326, and to the eighth multiplexer 334. The write allocate buffer 326 receives input from the second line fill buffer 338 and the write buffer 312. An eviction buffer 332 receives input from a memory 330 and outputs to the eighth multiplexer 334.

The first line read buffer 318 receives input from the memory 330 and outputs to the fourth multiplexer 308 and the second line read buffer 320 receives input from the memory 330 and outputs to the second multiplexer 304. The first line fill buffer 336 receives input from the HRDATAM0 signal and outputs to the sixth multiplexer 322 and the second line fill buffer 338 receives input from the HRDATAM1 signal and outputs to the seventh multiplexer.

The memory 330 stores data that is written to and read from by the various components in the resistive memory cache 300. The memory 330 has an output 340 and an input 342. In one implementation, the output 340 and the input 342 share the same port 341. Data intended to be written comes from the main multiplexer 328 and transfers into the memory 330 via the input 342. Data to be read from the memory 330 is output via the output 340 and sent to the first line read buffer 318.

The resistive memory cache 300 also includes an event monitor 316. Cache events 314 are input to the event monitor 316. Cache events 314 represent relevant events that occur in the resistive memory cache 300.

The read path is expressed as data transferred from the memory 330 via the output 340 to the first line read buffer 318 and the second line read buffer 320. The read path may also be on a critical path, the longest necessary path through components of the resistive memory cache 300 in order to perform a read or write operation.

The write path is expressed as data transferring from the write buffer 312 and the write allocate buffer 326 on one end (the top) and data from the first line fill buffer 336 and the second line fill buffer 338 on another end (the bottom) to the main multiplexer 328. Then, the data flows from the main multiplexer 328 to the memory 330. The write path may not be on the critical path.

Although the read path and the write path are separate, they may share the same port 341. A long write latency may block the input 342 and/or the output 340 because the shared input/output port 341 will be occupied by the long write operation. This in turn delays the read access. That is, the read operation may not be performed until the write operation is completed. As a result, the speed of the resistive memory cache 300 is made slower.

FIGS. 4A-4B are timing diagrams illustrating different write pulse configurations according to aspects of the present disclosure. A first timing diagram 400 shows the timing operation of a typical resistive memory device that uses a long write pulse. The first timing diagram 400 shows a clock signal 402, an arrival timing of a command 404, and an execution timing of a command 406. The command arrival timing 404 and the command execution timing 406 show arrival and execution of a number of read or write commands, shown here as "RD0", "RD1", "WR0", "RD2" and "RD3." Each of the arriving commands executes at a delayed time after the arrival.

In the example of the first timing diagram 400, a read operation takes two clock cycles and a write operation ("WR0") takes ten clock cycles. Therefore, as can be seen in the first timing diagram 400, the "WR0" command executes as a long, (e.g., ten clock cycle) "WR0" command. For this reason, the execution of the "RD2" and "RD3" commands are delayed, and can only be executed after completing execution of the "WR0" command. Because the read command(s) are forced to wait until the write command(s) is executed, the performance and speed of the resistive memory device is reduced.

A second timing diagram 410 shown in FIG. 4B illustrates the timing operation of a resistive memory device according to an aspect of the present disclosure that uses multiple short write pulses instead of one long write pulse. The second timing diagram 410 also shows the clock signal 402, the command arrival timing 404 and a revised command execution timing 408. In the second timing diagram 410, the arriving "WR0" command is divided into separate and smaller sub-commands. In this example, "WR0" is divided into five write sub-commands or pulses: "WR0-p1", "WR0-p2", "WR0-p3", "WR0-p4" and "WR0-p5" to be executed. Each of these shorter write operation sub-commands only takes two clock cycles to execute, which in this example is the same time it takes for a read operation to execute. Because the shorter "WR0-p1" sub-command is executed first, the read commands "RD2" and "RD3" can be executed sooner, or in between any of the write pulses. Then, the rest of the "WR0" sub-commands (p2-p5) are executed. Although this example describes the write pulse width as equal to the read pulse width, the shorter write pulse width can be of any length.

Distributing smaller write pulses around higher priority operations allows for the overall read/write operation to be improved. Therefore, the resistive memory device may be able to finish operations faster and in a more efficient manner. For example, the second timing diagram 410 has a performance improvement 412 of nearly eight (8) clock cycles in that all the read commands ("RD0" to "RD3") are completed nearly eight clock cycles before the read commands are executed in the first timing diagram 400.

When an incoming write command is received, the command is divided into sub-commands. The write command and/or the sub-commands can be stored in a write buffer. Each write buffer entry may contain data and an address. Moreover, each entry can also include the number of remaining write sub-commands associated with the write command. The number of remaining sub-commands can be implemented as a counter.

In one aspect of the present disclosure, an algorithm to improve resistive memory cache performance has four main steps.

First, the number of sub-commands, N, the write command will be divided into is determined. For example, a long write pulse operation may be split into N=5 sub-commands, as shown in FIG. 4B. Each sub-command will have a length corresponding to a number of clock cycles and can be uniform. In another implementation, every sub-command has different clock cycle lengths.

Second, when a new write command arrives and the write buffer is not full, the data and the address information entries are emptied. There is also a counter that tracks how many write sub-commands there are. The counter may start from N and count down, or may start from 0 and count up to N−1, or start from 1 and count up to N. The counter may be implemented in hardware.

Third, entries from the write buffer are drained whenever the read queue becomes empty. The oldest write buffer entry may be drained first. The short write pulses are applied one-by-one, and the counter is modified (either by decrementing (starting from 1V) or incrementing (starting from 0 or 1)). Once the counter reaches 0 (in the case of starting from N), then that write buffer entry is removed.

Fourth, when a new write command arrives and the write buffer is full, the read queue is blocked if the read queue is not empty. Then, the write sub-commands are executed until the oldest write buffer entry is freed. The second step above (emptying the data and address information entries) may also be repeated until the oldest write buffer entry is freed. The read queue may also be unblocked at this time, if desired.

Figure 5:
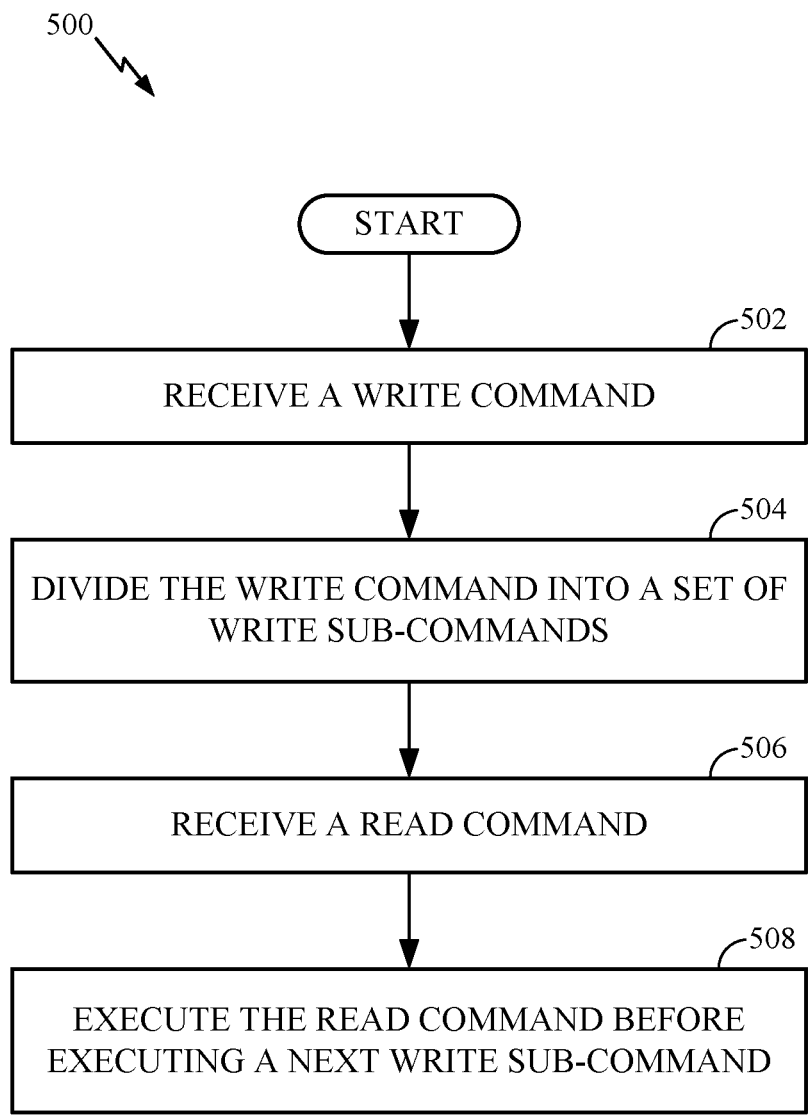
FIG. 5 is a process flow diagram illustrating a method of reading from and writing to a resistive memory cache according to an aspect of the present disclosure.

FIG. 5 is a process flow diagram illustrating a method 500 of reading from and writing to a resistive memory cache according to an aspect of the present disclosure. In block 502, a write command is received. In block 504, the write command is divided into a set of write sub-commands. In block 506, a read command is received. In block 508, the read command is executed before executing a next write sub-command. In one implementation, the method 500 also includes determining whether a write buffer is full, executing the read command when the write buffer is not full, and executing the next write sub-command when the write buffer is full, instead of executing the read command. In another implementation, the method 500 also creates a write buffer entry in response to receiving the write command. The entry includes data, an address, and a number of write sub-commands remaining. In that case, the method 500 may also include executing a write sub-command and modifying the number of write command sub-commands remaining after executing the write sub-command. Furthermore, the method 500 may also include removing the write buffer entry when the set of write sub-commands is executed.

Although blocks are shown in a particular sequence, the present disclosure is not so limited. Provided is a method to improve the performance of a resistive memory cache by splitting the write operation into smaller write pulses. If used correctly, the approach of the present disclosure can improve the performance of typical resistive memory devices. CPU performance may also be increased.

In the above, a resistive memory device or a resistive memory element can include a magnetic tunnel junction (MTJ), a magnetic random access memory (MRAM), a resistive random access memory (RRAM), or any resistive memory with a reference system.

According to a further aspect of the present disclosure, a resistive memory cache is provided. The resistive memory cache also includes means for storing data. The means for storing data includes the memory 330. In another configuration, the aforementioned means may be any module or any apparatus configured to perform the functions recited by the aforementioned means.

The resistive memory cache also includes means for buffering write operations. The means for buffering includes the write buffer 312 as well as the line read buffers 318 and 320, the line fill buffers 336 and 338, and the eviction buffer 332. In another configuration, the aforementioned means may be any module or any apparatus configured to perform the functions recited by the aforementioned means.

Figure 6:
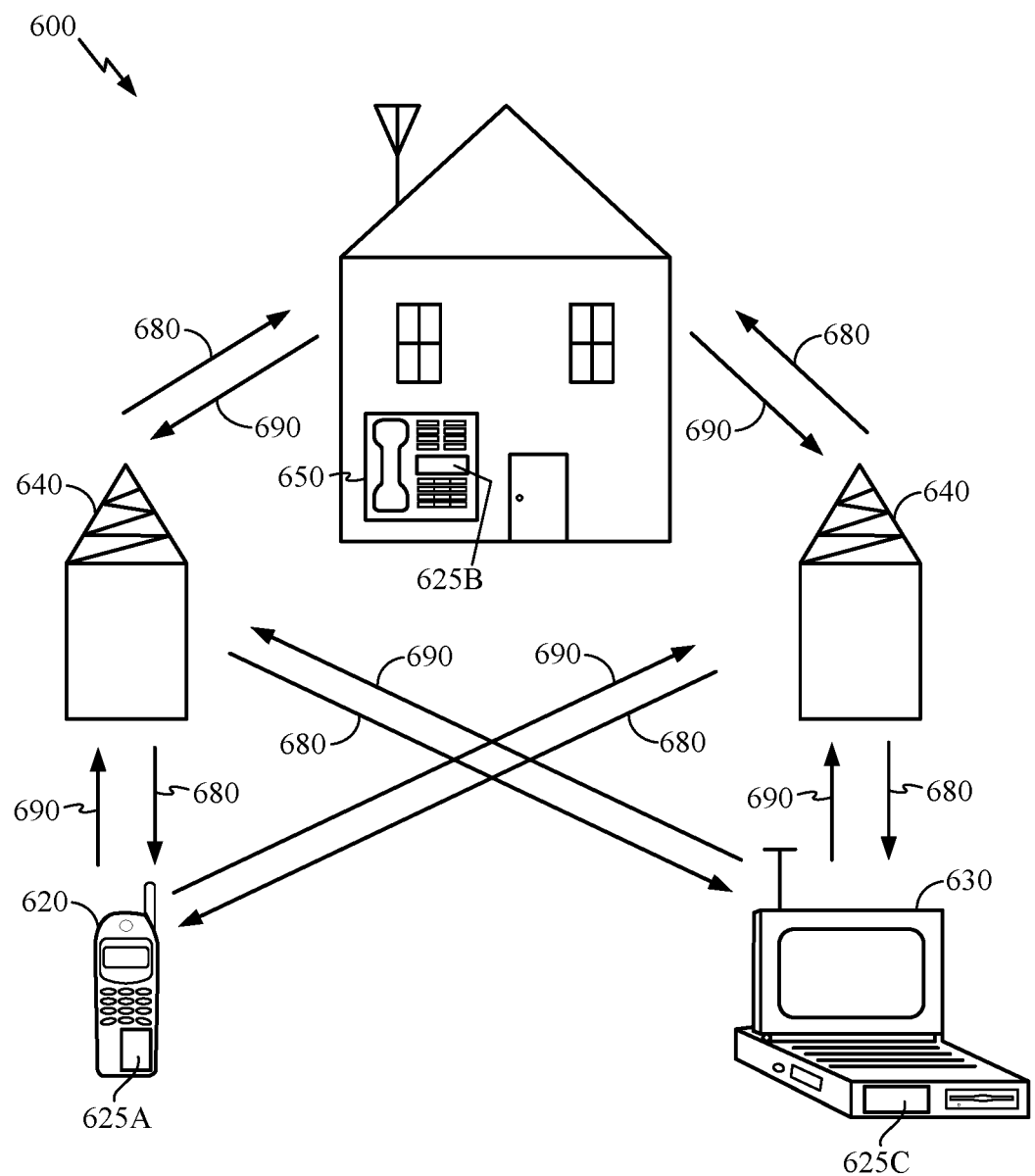
FIG. 6 is a block diagram showing an exemplary wireless communication system in which a configuration of the disclosure may be advantageously employed.

FIG. 6 is a block diagram showing an exemplary wireless communication system 600 in which an aspect of the disclosure may be advantageously employed. For purposes of illustration, FIG. 6 shows three remote units 620, 630, and 650 and two base stations 640. It will be recognized that wireless communication systems may have many more remote units and base stations. Remote units 620, 630, and 650 include IC devices 625A, 625C, and 625B that include the disclosed resistive memory devices or resistive memory caches. It will be recognized that other devices may also include the disclosed resistive memory devices, such as the base stations, switching devices, and network equipment. FIG. 6 shows forward link signals 680 from the base station 640 to the remote units 620, 630, and 650 and reverse link signals 690 from the remote units 620, 630, and 650 to base stations 640.

In FIG. 6, remote unit 620 is shown as a mobile telephone, remote unit 630 is shown as a portable computer, and remote unit 650 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or other devices that store or retrieve data or computer instructions, or combinations thereof. Although FIG. 6 illustrates remote units according to the aspects of the disclosure, the disclosure is not limited to these exemplary illustrated units. Aspects of the disclosure may be suitably employed in many devices, which include the disclosed resistive memory devices.

Figure 7:
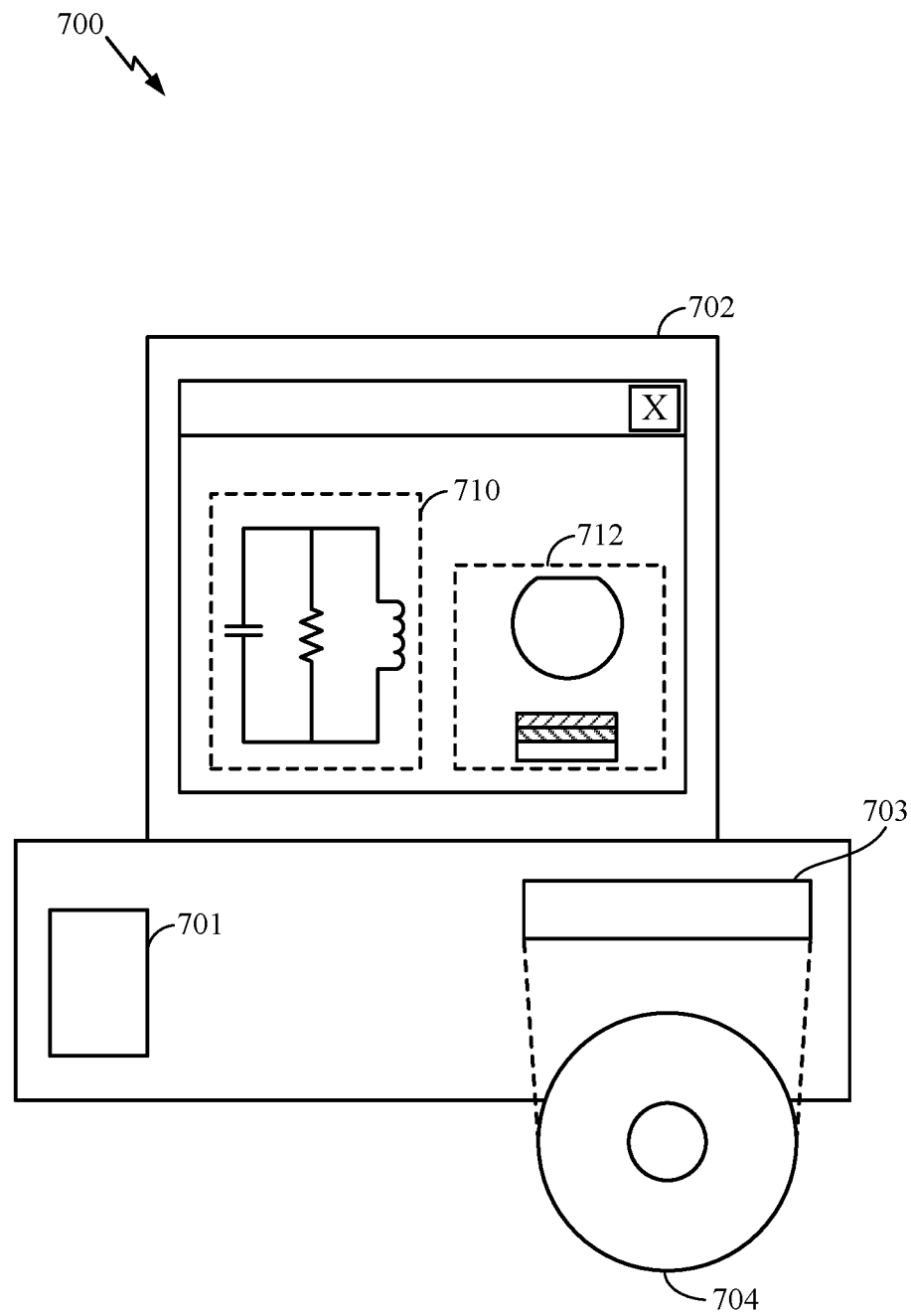
FIG. 7 is a block diagram illustrating a design workstation used for circuit, layout, and logic design of a semiconductor component according to one configuration.

FIG. 7 is a block diagram illustrating a design workstation 700 used for circuit, layout, and logic design of a semiconductor component, such as the resistive memory devices disclosed above. A design workstation 700 includes a hard disk 701 containing operating system software, support files, and design software such as Cadence or OrCAD. The design workstation 700 also includes a display 702 to facilitate design of a circuit 710 or a semiconductor component 712 such as a resistive memory device. A storage medium 704 is provided for tangibly storing the circuit design 710 or the semiconductor component 712. The circuit design 710 or the semiconductor component 712 may be stored on the storage medium 704 in a file format such as GDSII or GERBER. The storage medium 704 may be a CD-ROM, DVD, hard disk, flash memory, or other appropriate device. Furthermore, the design workstation 700 includes a drive apparatus 703 for accepting input from or writing output to the storage medium 704.

Data recorded on the storage medium 704 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 704 facilitates the design of the circuit design 710 or the semiconductor component 712 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. A method of reading from and writing to a resistive memory cache, comprising:
   receiving a write command;
   dividing the write command into a plurality of write sub-commands;
   receiving a read command; and
   executing the read command to read from the resistive memory cache before executing a next write sub-command for writing to the resistive memory cache.

2. The method of claim 1, further comprising:
   determining whether a write buffer for the resistive memory cache is full;
   executing the read command to read from the resistive memory cache when the write buffer for the resistive memory cache is not full; and executing the next write sub-command to write to the resistive memory cache when the write buffer for the resistive memory cache is full until the write command for writing to the resistive memory cache is completed, instead of executing the read command for reading from the resistive memory cache.

3. The method of claim 1, further comprising creating a write buffer entry in response to receiving the write command, the entry comprising data, an address, and a number of the plurality of write sub-commands remaining.

4. The method of claim 3, further comprising:
executing a write sub-command to write to the resistive memory cache; and
modifying the number of the plurality of write sub-commands remaining after executing the write sub-command.

5. The method of claim 4, further comprising removing the write buffer entry when the plurality of write sub-commands for writing to the resistive memory cache are executed.

6. The method of claim 1, further comprising integrating the resistive memory cache into a mobile phone, a set top box, a music player, a video player, an entertainment unit, a navigation device, a computer, a hand-held personal communication systems (PCS) unit, a portable data unit, and/or a fixed location data unit.

7. A method of reading from and writing to a resistive memory cache, comprising:
the step of receiving a write command;
the step of dividing the write command into a plurality of write sub-commands;
the step of receiving a read command; and
the step of executing the read command to read from the resistive memory cache before executing a next write sub-command for writing to the resistive memory cache.

8. The method of claim 7, further comprising:
the step of determining whether a write buffer for the resistive memory cache is full;
the step of executing the read command to read from the resistive memory cache when the write buffer for the resistive memory cache is not full; and
the step of executing the next write sub-command to write to the resistive memory cache when the write buffer for the resistive memory cache is full until the write command for writing to the resistive memory cache is completed, instead of executing the read command for reading from the resistive memory cache.

9. The method of claim 7, further comprising the step of creating a write buffer entry in response to receiving the write command, the entry comprising data, an address, and a number of the plurality of write sub-commands remaining.

10. The method of claim 9, further comprising:
the step of executing a write sub-command to write to the resistive memory cache; and
the step of modifying the number of the plurality of write sub-commands remaining after executing the write sub-command.

11. The method of claim 10, further comprising the step of removing the write buffer entry when the plurality of write sub-commands for writing to the resistive memory cache are executed.

12. The method of claim 7, further comprising the step of integrating the resistive memory cache into a mobile phone, a set top box, a music player, a video player, an entertainment unit, a navigation device, a computer, a hand-held personal communication systems (PCS) unit, a portable data unit, and/or a fixed location data unit.

13. A non-transitory computer readable medium having program code recorded thereon for reading from and writing to a resistive memory cache, the program code being executed by a processor and comprising:
program code to receive a write command;
program code to divide the write command into a plurality of write sub-commands;
program code to receive a read command; and
program code to execute the read command to read from the resistive memory cache before executing a next write sub-command for writing to the resistive memory cache.

14. The non-transitory computer readable medium of claim 13, further comprising:
program code to determine whether a write buffer for the resistive memory cache is full;
program code to execute the read command to read from the resistive memory cache when the write buffer for the resistive memory cache is not full; and
program code to execute the next write sub-command to write to the resistive memory cache when the write buffer for the resistive memory cache is full until the write command for writing to the resistive memory cache is completed, instead of executing the read command for reading from the resistive memory cache.

15. The non-transitory computer readable medium of claim 13, further comprising program code to create a write buffer entry in response to receiving the write command, the entry comprising data, an address, and a number of the plurality of write sub-commands remaining.

16. The non-transitory computer readable medium of claim 15, further comprising:
program code to execute a write sub-command to write to the resistive memory cache; and
program code to modify the number of the plurality of write sub-commands remaining after executing the write sub-command.

17. The non-transitory computer readable medium of claim 16, further comprising program code to remove the write buffer entry when the plurality of write sub-commands for writing to the resistive memory cache are executed.

18. The non-transitory computer readable medium of claim 13, integrated into a mobile phone, a set top box, a music player, a video player, an entertainment unit, a navigation device, a computer, a hand-held personal communication systems (PCS) unit, a portable data unit, and/or a fixed location data unit.

* * * * *